(12) United States Patent
Hwang

(10) Patent No.: US 11,275,402 B2
(45) Date of Patent: Mar. 15, 2022

(54) READ CLOCK GENERATION CIRCUIT AND DATA PROCESSING CIRCUIT INCLUDING THE SAME

(71) Applicant: SK hynix Inc., Gyeonggi-do (KR)

(72) Inventor: Minsoon Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 184 days.

(21) Appl. No.: 16/694,385

(22) Filed: Nov. 25, 2019

(65) Prior Publication Data

US 2020/0387190 A1 Dec. 10, 2020

(30) Foreign Application Priority Data

Jun. 10, 2019 (KR) .................. 10-2019-0067809

(51) Int. Cl.
| | |
|---|---|
| *G06F 1/12* | (2006.01) |
| *G06F 1/08* | (2006.01) |
| *H03K 23/50* | (2006.01) |
| *G11C 7/10* | (2006.01) |
| *G11C 7/22* | (2006.01) |
| *G06F 1/06* | (2006.01) |
| *G06F 5/06* | (2006.01) |
| *G06F 1/04* | (2006.01) |

(Continued)

(52) U.S. Cl.
CPC .................. *G06F 1/12* (2013.01); *G06F 1/08* (2013.01); *G11C 7/1072* (2013.01); *G11C 7/222* (2013.01); *H03K 23/50* (2013.01); *G06F 1/04* (2013.01); *G06F 1/06* (2013.01); *G06F 5/06* (2013.01); *G06F 13/1689* (2013.01); *G06F 13/4291* (2013.01)

(58) Field of Classification Search
CPC ..... G06F 1/12; G06F 1/04; G06F 1/06; G06F 13/1689; G06F 5/06; G06F 13/4291; G06F 1/08; G11C 7/1072; G11C 7/222; H03K 23/50
USPC ............... 713/400, 500, 600; 710/52, 61, 71
See application file for complete search history.

(56) References Cited

U.S. PATENT DOCUMENTS

| 5,502,750 A | * | 3/1996 | Co | H04J 3/0626 370/516 |
|---|---|---|---|---|
| 5,619,506 A | * | 4/1997 | Burch | H04J 3/073 370/506 |

(Continued)

FOREIGN PATENT DOCUMENTS

KR 1020110037339 4/2011

*Primary Examiner* — Ji H Bae
(74) *Attorney, Agent, or Firm* — IP & T Group LLP

(57) ABSTRACT

A read clock generation circuit may include a multiplexer selecting one of divided clock signals in response to a selection signal and outputting the selected divided clock signal as a preliminary read clock signal, a detection circuit generating a detection signal for indicating detection timing of a divided clock signal having the fastest second edge after the first edge of a write clock signal, among the divided clock signals, based on a result of a comparison between the phases of the divided clock signals and the phase of the write clock signal, a counter generating the selection signal by counting the detection signal in response to the write clock signal, and a correction circuit outputting, as a read clock signal, a signal from which pulses corresponding to an invalid section have been removed, among the pulses of the preliminary read clock signal, in response to the detection signal.

11 Claims, 4 Drawing Sheets

(51) Int. Cl.
*G06F 13/16* (2006.01)
*G06F 13/42* (2006.01)

(56) References Cited

U.S. PATENT DOCUMENTS

| | | | |
|---|---|---|---|
| 6,629,251 B1* | 9/2003 | Anderson | G06F 1/06 710/52 |
| 2002/0019952 A1* | 2/2002 | Ueno | H04L 25/0262 713/500 |
| 2007/0075877 A1* | 4/2007 | Goller | G06F 13/4291 341/50 |
| 2009/0213033 A1* | 8/2009 | Chen | G09G 3/3611 345/1.1 |

\* cited by examiner

READ CLOCK GENERATION CIRCUIT AND DATA PROCESSING CIRCUIT INCLUDING THE SAME

CROSS-REFERENCE TO RELATED APPLICATION

The present application claims priority under 35 U.S.C. § 119(a) to Korean application number 10-2019-0067809, filed on Jun. 10, 2019, which is incorporated herein by reference in its entirety.

BACKGROUND

1. Technical Field

Various embodiments generally relate to a semiconductor circuit, and particularly, to a read clock generation circuit and a data processing circuit including the same.

2. Related Art

An electronic device, such as a computer, a mobile phone, or a storage apparatus, may include integrated circuits in which various devices or circuits have been integrated.

Each of the integrated circuits may be electrically coupled to one or more external circuits or apparatuses, and may include an element for interfacing between the external circuit and the apparatus. For example, a peripheral device, such as a memory device, may be electrically coupled to a memory controller to configure a memory system.

The memory system may include a data processing circuit for a data interface with the inside and/or the outside, for example, a serializer for converting parallel data into serial data and outputting the serial data.

SUMMARY

Various embodiments are directed to the provision of a read clock generation circuit for stable data processing and a data processing circuit including the same.

In an embodiment, a read clock generation circuit may include a multiplexer configured to select one of a plurality of divided clock signals in response to a selection signal and output the selected divided clock signal as a preliminary read clock signal, a detection circuit configured to generate a detection signal based on a result of a comparison in phases of the plurality of divided clock signals and a write clock signal, the detection signal indicating detection timing of a divided clock signal having a fastest second edge after a first edge of the write clock signal, among the plurality of divided clock signals; a counter configured to count the write clock signal in response to the detection signal to generate the selection signal; and a correction circuit configured to deactivate the preliminary read clock signal during an invalid section determined in response to the detection signal to output a read clock signal.

In an embodiment, a data processing circuit may include a read clock generation circuit configured to output, as a read clock signal, a divided clock signal having a fastest second edge after a first edge of a write clock signal, among a plurality of divided clock signals, based on a result of a comparison in phases of the plurality of divided clock signals and the write clock signal, and a first in first out (FIFO) circuit configured to receive input data in response to the write clock signal and output the input data as output data in response to the read clock signal.

In an embodiment, a serializer for converting parallel data into serial data may include a division circuit configured to divide a source clock signal by a division ratio to generate a plurality of divided clock signals; a multiplexer configured to select one of the plurality of divided clock signals in response to a selection signal, and output the selected divided clock signal as a preliminary read clock signal; a detection circuit configured to generate a detection signal based on a result of a comparison in phases of the plurality of divided clock signals and a write clock signal, the detection signal indicating detection timing of a divided clock signal having a fastest second edge after a first edge of the write clock signal, among the plurality of divided clock signals; a counter configured to count the write clock signal in response to the detection signal to generate the selection signal; a correction circuit configured to deactivate the preliminary read clock signal during an invalid section determined in response to the detection signal to output a read clock signal; and a first in first out (FIFO) circuit configured to receive input data in response to the write clock signal, and output the input data as output data in response to the read clock signal.

DETAILED DESCRIPTION

Figure 1:
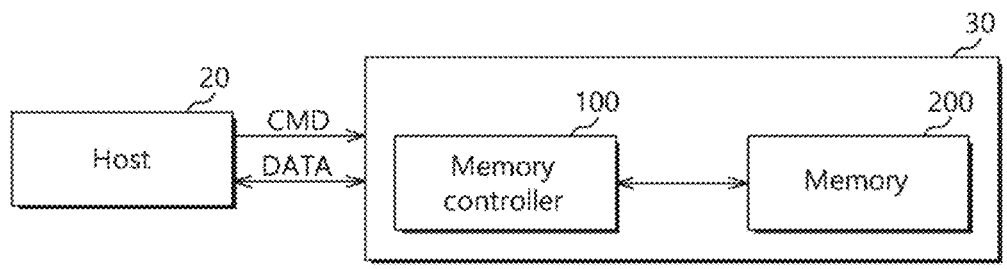
FIG. 1 is a diagram illustrating a data processing system according to an embodiment.

The advantages and characteristics of the present disclosure and a method for achieving the advantages and characteristics will be described through the following embodiments with reference to the accompanying drawings. However, the present disclosure is not limited to the embodiments described herein, but may be embodied in different manners. The present embodiments are only provided to describe the present disclosure in detail, such that the technical idea of the present disclosure can be easily carried out by those skilled in the art to which the present disclosure pertains.

Throughout the specification, when a certain element is "coupled" to another element, it may not only indicate that the former element is "directly coupled to" the latter element, but also indicate that the former element is "indirectly coupled to" the latter element with another element interposed therebetween. In this specification, when an element "includes or comprises" a component, it may indicate that the element does not exclude another component unless referred to the contrary, but can further include or comprise another component.

Hereafter, embodiments will be described in detail with reference to the accompanying drawings. The same components in the accompanying drawings will be represented by like reference numerals. Moreover, detailed descriptions related to well-known functions or configurations will be omitted in order not to unnecessarily obscure subject matters of the present embodiment.

Hereinafter, a read clock generation circuit and a data processing circuit including the same will be described below in more detail with reference to the accompanying drawings through various examples of embodiments.

FIG. 1 is a diagram illustrating a data processing system 10 according to an embodiment.

Referring to FIG. 1, the data processing system 10 may include a host 20 and a memory system 30 which is a peripheral apparatus of the host 20.

The host 20 may include portable electronic devices, such as a mobile phone, an MP3 player and a laptop computer. Further, the host 20 may include electronic devices, such as a desktop computer, a game machine, TV and a projector.

The memory system 30 may be accessed in response to a command from the host 20, and may be used as a primary storage apparatus or a secondary storage apparatus of the host 20.

The memory system 30 may include a memory controller 100 and a memory 200.

The memory controller 100 may perform an access operation on the memory 200 in response to a command from the host 20.

Specifically, the memory controller 100 may write data from the host 20 in the memory 200 in response to a write command from the host 20. Furthermore, the memory controller 100 may read data stored in the memory 200 in response to a read command from the host 20 then transmit the read data to the host 20.

The memory controller 100 may include a serializer for converting parallel data, output from the host 20 and/or the memory 200, into serial data.

The memory 200 may include a volatile memory, such as a dynamic random access memory (DRAM) and a static RAM (SRAM).

In other embodiments, the memory 200 may include a non-volatile memory, such as a read only memory (ROM), a mask ROM (MROM), a programmable ROM (PROM), an erasable and programmable ROM (EPROM), an electrically erasable and programmable ROM (EEPROM), a ferromagnetic ROM (FRAM), a phase change RAM (PRAM), a magnetic RAM (MRAM), a resistive RAM (RRAM) or a flash memory.

Figure 2:
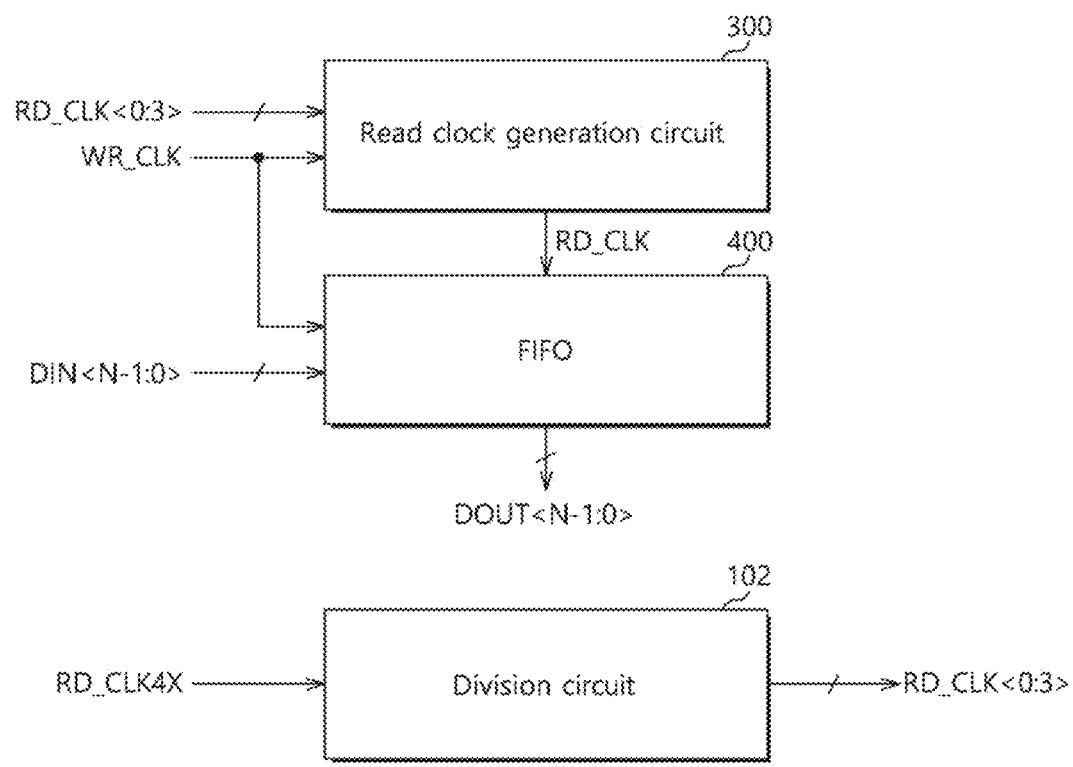
FIG. 2 is a diagram illustrating a data processing circuit according to an embodiment.

FIG. 2 is a diagram illustrating a data processing circuit 101 according to an embodiment.

The data processing circuit 101 may serve as a serializer included in the memory controller 100 that receives parallel data.

Referring to FIG. 2, the data processing circuit 101 may include a read clock generation circuit 300 and a first in first out (FIFO) circuit 400. The data processing circuit 101 may further include a division circuit 102.

The division circuit 102 may generate a plurality of divided clock signals RD_CLK<0:3> by dividing a source clock signal RD_CLK 4X at a predetermined division ratio (e.g., by dividing a frequency of the source clock signal RD_CLK 4X by 4).

The plurality of divided clock signals RD_CLK<0:3> may have the same phase difference (e.g., a phase difference of one clock cycle based on the source clock signal RD_CLK4X).

The read clock generation circuit 300 may output a read clock signal RD_CLK based on the plurality of divided clock signals RD_CLK<0:3> and a write clock signal WR_CLK.

The source clock signal RD_CLK4X and the write clock signal WR_CLK may be generated from independent sources. The divided clock signals RD_CLK<0:3> may be generated based on the source clock signal RD_CLK4X.

Because the write clock signal WR_CLK and the plurality of divided clock signals RD_CLK<0:3> are generated from different signal sources, the plurality of divided clock signals RD_CLK<0:3> may have an asynchronous relation with the write clock signal WR_CLK. That is, the write clock signal WR_CLK and the divided clock signals RD_CLK<0:3> are not aware of the phase differences therebetween and are not provided with any information on the phase differences therebetween.

The read clock generation circuit 300 may select a divided clock signal having the fastest second edge (e.g., a rising edge) after a first edge (e.g., a falling edge) of the write clock signal WR_CLK, among the plurality of divided clock signals RD_CLK<0:3>, based on a result of a comparison in phases of the write clock signal WR_CLK and the plurality of divided clock signals RD_CLK<0:3>, and may output the selected divided clock signal as the read clock signal RD_CLK.

The FIFO circuit 400 may receive input data DIN<N−1:0> in response to a write clock signal WR_CLK, and may output the input data DIN<N−1:0> as output data DOUT<N−1:0> in response to a read clock signal RD_CLK.

The write clock signal WR_CLK may be a signal transmitted from a circuit that transmits the input data DIN<N−1:0>, to the data processing circuit 101 or may be a signal generated by the data processing circuit 101 by using a source clock signal from the circuit that transmits the input data DIN<N−1:0>.

Figure 3:
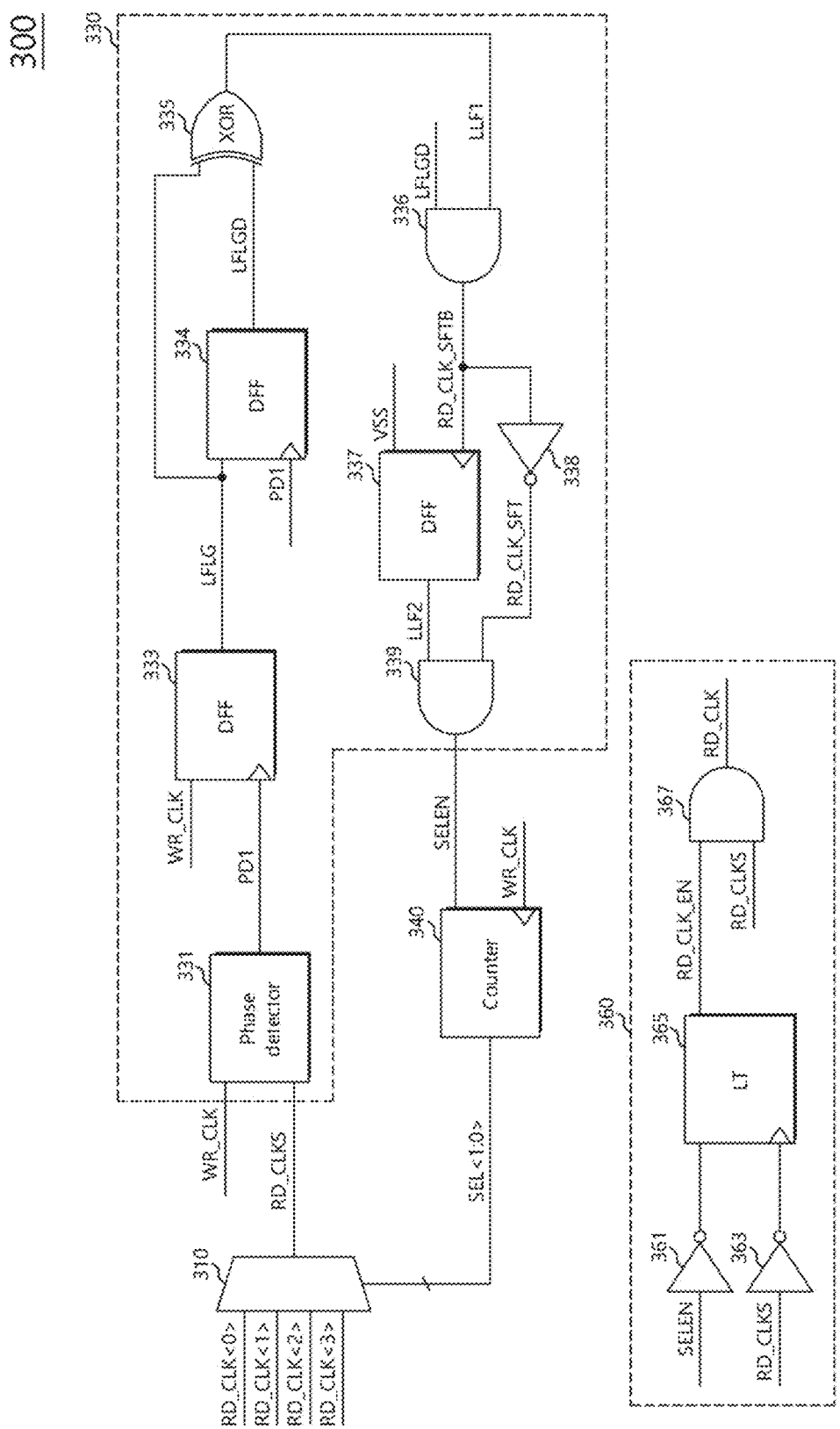
FIG. 3 is a detailed diagram of a read clock generation circuit illustrated in FIG. 2.

FIG. 3 is a detailed diagram of the read clock generation circuit 300 illustrated in FIG. 2.

Referring to FIG. 3, the read clock generation circuit 300 may include a multiplexer 310, a detection circuit 330 and a counter 340.

The read clock generation circuit 300 may further include a correction circuit 360.

The multiplexer 310 may select one of the plurality of divided clock signals RD_CLK<0:3> in response to a selection signal SEL<1:0>, and may output the selected clock signal as a preliminary read clock signal RD_CLKS.

The detection circuit 330 may generate a detection signal SELEN based on a result of a comparison in phases of the plurality of divided clock signals RD_CLK<0:3> and the phase of the write clock signal WR_CLK. The detection signal SELEN may indicate the detection timing of a divided clock signal having a fastest rising edge after a falling edge of the write clock signal WR_CLK, among the plurality of divided clock signals RD_CLK<0:3>.

The detection circuit 330 may include a phase detector 331, first to fourth logic gates 335, 336, 338, and 339, and first to third flipflops 333, 334, and 337.

The phase detector 331 may compare the phase of the preliminary read clock signal RD_CLKS and the phase of the write clock signal WR_CLK to generate a phase detection signal PD1.

The first flipflop 333 may latch the write clock signal WR_CLK in response to the phase detection signal PD1 to generate a phase flag LFLG.

If the level of the phase detection signal PD1 is at a high logic level, that is, the phase of the write clock signal WR_CLK lags behind the phase of the preliminary read clock signal RD_CLKS, the first flipflop 333 may generate the phase flag LFLG by latching the write clock signal WR_CLK.

The second flipflop 334 may latch the phase flag LFLG in response to the phase detection signal PD1 to generate a shifted phase flag LFLGD.

The first logic gate 335 may perform a logic operation (e.g., an exclusive OR operation) on the phase flag LFLG and the shifted phase flag LFLGD to generate an output signal LLF1.

The second logic gate 336 may perform a logic operation (e.g., a logical product) on the output signal LLF1 of the first logic gate 335 and the shifted phase flag LFLGD to generate a shifted read clock signal RD_CLK_SFTB.

The third flipflop 337 may latch a level of a ground voltage VSS in response to the shifted read clock signal RD_CLK_SFTB to generate an output signal LLF2.

The third flipflop 337 may initially maintain a level of the output signal LLF2 to a high logic level, and may shift the level of the output signal LLF2 to a low logic level when the level of the shifted read clock signal RD_CLK_SFTB shifts to a high logic level. Each of the first to third flipflops 333, 334, and 337 may be a D-flipflop.

The third logic gate 338 may invert the shifted read clock signal RD_CLK_SFTB to output a signal RD_CLK_SFT.

The fourth logic gate 339 may perform a logic operation (e.g., a logical product) on the output signal LLF2 of the third flipflop 337 and the output signal RD_CLK_SFT of the third logic gate 338 to generate the detection signal SELEN.

The counter 340 may count the write clock signal WR_CLK in response to the detection signal SELEN to generate a selection signal SEL<1:0>.

The correction circuit 360 may deactivate the preliminary read clock signal RD_CLKS during an invalid section determined in response to the detection signal SELEN, to output a read clock signal RD_CLK.

The correction circuit 360 may include a latch (LT) 365 and fifth to seventh logic gates 361, 363, and 367.

The fifth logic gate 361 may invert the detection signal SELEN.

The sixth logic gate 363 may invert the preliminary read clock signal RD_CLKS.

The latch 365 may latch the output signal of the fifth logic gate 361 in response to the output signal of the sixth logic gate 363 to generate a read clock-valid section signal RD_CLK_EN.

The seventh logic gate 367 may perform a logic operation (e.g., a logical product) on the read clock-valid section signal RD_CLK_EN and the preliminary read clock signal RD_CLKS to output the obtained signal as the read clock signal RD_CLK.

The seventh logic gate 367 may selectively activate the pulses of the preliminary read clock signal RD_CLKS while the read clock-valid section signal RD_CLK_EN is activated at a high level to output the read clock signal RD_CLK.

Figure 4:
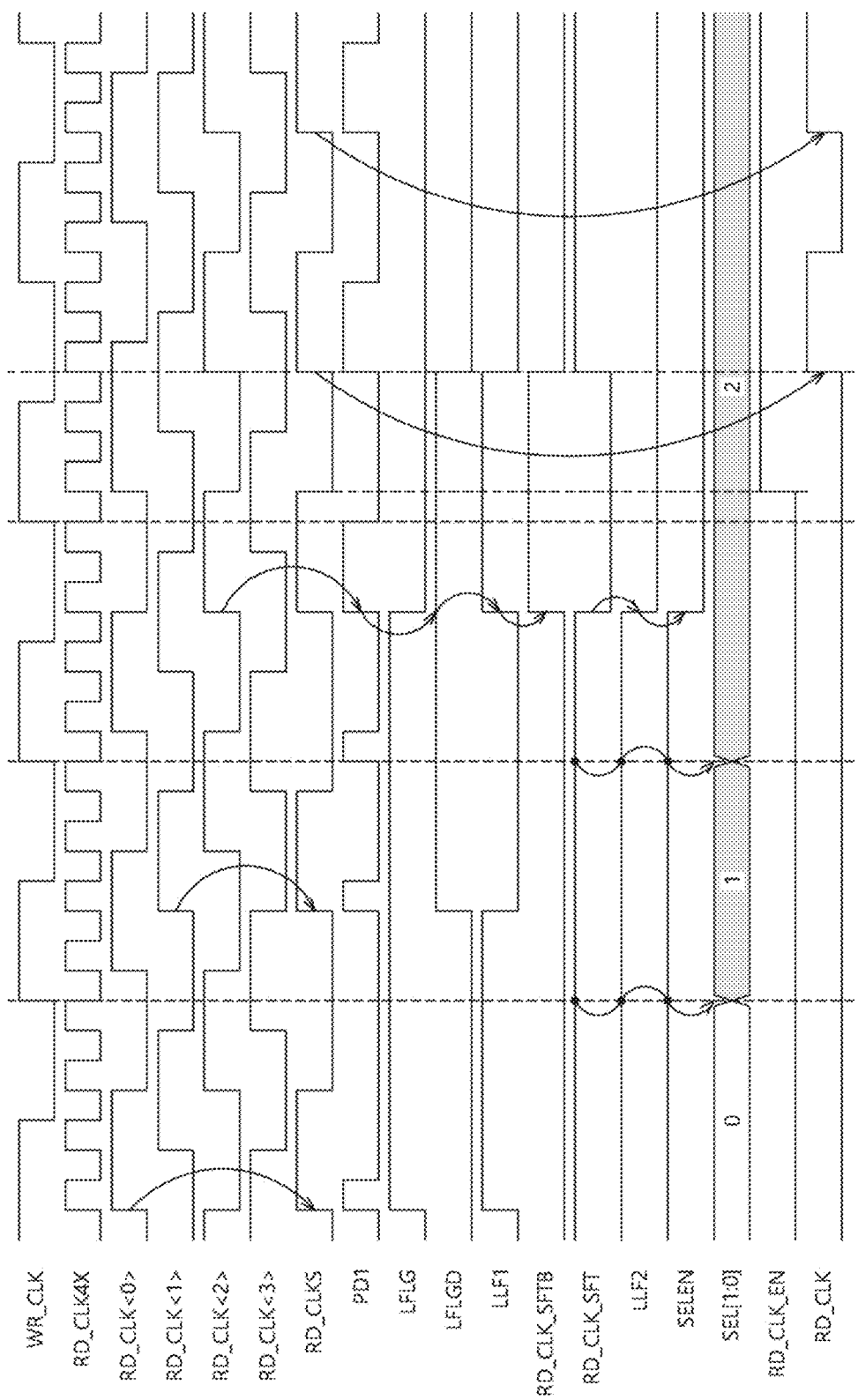
FIG. 4 is a timing diagram for describing an operation of the read clock generation circuit illustrated in FIG. 3.

FIG. 4 is a timing diagram describing an operation of the read clock generation circuit 300 illustrated in FIG. 3.

An exemplary operation of the read clock generation circuit 300 will be described as follows with reference to FIG. 4.

The plurality of divided clock signals RD_CLK<0:3> may be generated by dividing the source clock signal RD_CLK4X.

The write clock signal WR_CLK and the plurality of divided clock signals RD_CLK<0:3> are not aware of the phase differences therebetween and are not provided with any information on phase differences therebetween.

For example, the plurality of divided clock signals RD_CLK<0:3> and the write clock signal WR_CLK have phase differences as illustrated in FIG. 4.

The selection signal SEL<1:0> may have an initial value, for example, a value of "0."

Because the selection signal SEL<1:0> has a value of "0", one of the plurality of divided clock signals RD_CLK<0:3>, for example, the divided clock signal RD_CLK<0> may be output as the preliminary read clock signal RD_CLKS.

The preliminary read clock signal RD_CLKS, that is, the phase detection signal PD1 corresponding to a phase difference between the divided clock signal RD_CLK0 and the write clock signal WR_CLK, may be generated.

A level of the write clock signal WR_CLK corresponding to the rising edge of the phase detection signal PD1 may be output as the phase flag LFLG.

A level of the phase flag LFLG corresponding to the rising edge of the phase detection signal PD1 may be output as the shifted phase flag LFLGD.

The signal LLF1 may be obtained by performing an exclusive OR operation of the phase flag LFLG and the shifted phase flag LFLGD, and a signal obtained by performing a logical product on signal LLF1 and the shifted phase flag LFLGD may be output as the shifted read clock signal RD_CLK_SFTB.

A logic level of the shifted read clock signal RD_CLK_SFTB may shift in response to the rising edge of the preliminary read clock signal RD_CLKS generated right after the falling edge of the write clock signal WR_CLK.

More specifically, if the rising edge of the preliminary read clock signal RD_CLKS is generated between the falling edge and next rising edge of the write clock signal WR_CLK, a logic level of the shifted read clock signal RD_CLK_SFTB shifts from "low" to "high."

A logic level of the signal RD_CLK_SFT obtained by inverting the shifted read clock signal RD_CLK_SFTB shifts from "high" to "low."

The rising edge of the preliminary read clock signal RD_CLKS not generated between the falling edge and rising edge of the write clock signal WR_CLK in a section in which the selection signal SEL<1:0> has a value of "0." Accordingly, the level of the shifted read clock signal RD_CLK_SFTB is maintained as a low logic level, and the level of the signal RD_CLK_SFT is also maintained as a high logic level.

The level of the signal LLF2 is maintained as a high logic level because the level of the shifted read clock signal RD_CLK_SFTB is at a low logic level.

The level of the detection signal SELEN is maintained as a high logic level because the level of the signal LLF2 is at a high logic level and the level of the signal RD_CLK_SFT is also at a high logic level.

The level of the read clock-valid section signal RD_CLK_EN is maintained as a low logic level because the level of the inverted detection signal SELEN is at a low logic level at timing in which the falling edge of the preliminary read clock signal RD_CLKS is generated.

The output of a read clock signal RD_CLK is blocked because the level of the read clock-valid section signal RD_CLK_EN is at a low logic level. That is, the level of the read clock signal RD_CLK is maintained as a low logic level.

Because the level of the detection signal SELEN is at a high logic level, a value of the selection signal SEL<1:0> increases to "1" in response to the rising edge of the write clock signal WR_CLK.

Because the selection signal SEL<1:0> has a value of "1", another of the plurality of divided clock signals RD_CLK<0:3>, for example, the divided clock signal RD_CLK1 may be output as the preliminary read clock signal RD_CLKS.

In a section in which the selection signal SEL<1:0> has a value of "1", the rising edge of the preliminary read clock signal RD_CLKS is not generated between the falling edge and rising edge of the write clock signal WR_CLK. Accordingly, the level of the shifted read clock signal RD_CLK_SFTB is maintained as a low logic level, and the level of the signal RD_CLK_SFT is also maintained as a high logic level.

The level of the signal LLF2 is maintained a high logic level because the level of the shifted read clock signal RD_CLK_SFTB is at a low logic level.

The level of the detection signal SELEN is maintained as a high logic level because the level of the signal LLF2 is at a high logic level and the level of the signal RD_CLK_SFT is at a high logic level.

The level of the read clock-valid section signal RD_CLK_EN is maintained as a low logic level because the level of the inverted detection signal SELEN is at a low logic level at a timing in which the falling edge of the preliminary read clock signal RD_CLKS is generated.

The output of the read clock signal RD_CLK is blocked because the level of the read clock-valid section signal RD_CLK_EN is at a low logic level. That is, the level of the read clock signal RD_CLK is maintained as a low logic level.

Because the level of the detection signal SELEN is at a high logic level, a value of the selection signal SEL<1:0> increases to "2" in response to the rising edge of the write clock signal WR_CLK.

Because the selection signal SEL<1:0> has a value of "2", still another of the plurality of divided clock signals RD_CLK<0:3>, for example, the divided clock signal RD_CLK2 may be output as the preliminary read clock signal RD_CLKS.

In a section in which the selection signal SEL<1:0> has a value of "2", the rising edge of the preliminary read clock signal RD_CLKS is generated between the falling edge and rising edge of the write clock signal WR_CLK. Accordingly, the level of the shifted read clock signal RD_CLK_SFTB shifts to a high logic level, and the level of the signal RD_CLK_SFT shifts to a low logic level.

The level of the signal LLF2 shifts to a low logic level because the level of the shifted read clock signal RD_CLK_SFTB is at a high logic level.

The level of the detection signal SELEN shifts to a low logic level because the level of the signal LLF2 is at a low logic level and the level of the signal RD_CLK_SFT is also at a low logic level.

A value of the selection signal SEL<1:0> is maintained as "2" because the level of the detection signal SELEN is at a low logic level.

The level of the read clock-valid section signal RD_CLK_EN shifts to a high logic level because the level of the inverted detection signal SELEN is at a high logic level at timing in which the falling edge of the preliminary read clock signal RD_CLKS is generated.

The preliminary read clock signal RD_CLKS is output as the read clock signal RD_CLK because the level of the read clock-valid section signal RD_CLK_EN is at a high logic level.

Figure 5:
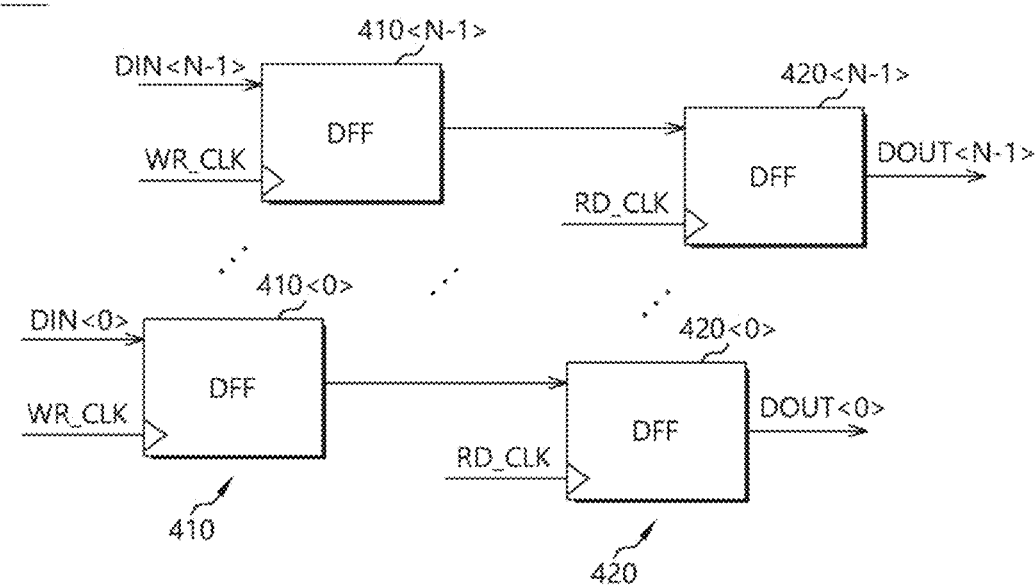
FIG. 5 is a detailed diagram of an FIFO circuit illustrated in FIG. 2.

FIG. 5 is a detailed diagram of the FIFO circuit 400 illustrated in FIG. 2.

Referring to FIG. 5, the FIFO circuit 400 may include first and second flipflop arrays 410 and 420.

The first flipflop array 410 may include first to n-th flipflops 410<0> to 410<N-1>. Each of the first to n-th flipflops 410<0> to 410<N-1> may be a D-flipflop. For example, the first flipflop 410<0> may latch a corresponding input data DIN<0> in response to the write clock signal WR_CLK, and the n-th flipflop 410<N-1> may latch a corresponding input data DIN<N-1> in response to the write clock signal WR_CLK.

The second flipflop array 420 may include first to n-th flipflops 420<0> to 420<N-1>. Each of the first to n-th flipflops 420<0> to 420<N-1> may be a D-flipflop. For example, the first flipflop 420<0> may latch a corresponding input data DIN<0> latched in the first flipflop 410<0> of the first flipflop array 410 in response to the read clock signal RD_CLK, and output a corresponding output data DOUT<0>. Further, the first flipflop 420<N-1> may latch a corresponding input data DIN<N-1> latched in the first flipflop 410<N> of the first flipflop array 410 in response to the read clock signal RD_CLK, and output a corresponding output data DOUT<N-1>.

As described above, the write clock signal WR_CLK and the divided clock signals RD_CLK<0:3> are not aware of phase differences therebetween and are not provided with any information on the phase differences.

In an embodiment of this disclosure, data may be received stably and rapidly by using, as the read clock signal RD_CLK, a divided clock signal having the fastest second edge (e.g., a rising edge) after a first edge (e.g., a falling edge) of the write clock signal WR_CLK.

While various embodiments have been described above, it will be understood to those skilled in the art that the embodiments described are by way of example only. Accordingly, the circuits described herein should not be limited based on the described embodiments.

While the present invention has been described with respect to the specific embodiments, it will be apparent to those skilled in the art that various changes and modifications may be made without departing from the spirit and scope of the invention as defined in the following claims.

What is claimed is:
1. A read clock generation circuit comprising:
   a multiplexer configured to select one of a plurality of divided clock signals in response to a selection signal, and output the selected divided clock signal as a preliminary read clock signal;
   a detection circuit configured to generate a detection signal based on a result of a phase comparison between the preliminary read clock signal and a write clock signal, the detection signal indicating detection of a divided clock signal having a fastest second edge after a first edge of the write clock signal, among the plurality of divided clock signals;
   a counter configured to count the write clock signal in response to the detection signal to generate the selection signal; and
   a correction circuit configured to deactivate the preliminary read clock signal during an invalid section determined in response to the detection signal to output a read clock signal.
2. The read clock generation circuit according to claim 1, wherein the plurality of divided clock signals have a same phase difference therebetween.
3. The read clock generation circuit according to claim 1, wherein the detection circuit comprises:

a phase detector configured to compare a phase of the preliminary read clock signal with a phase of the write clock signal to generate a phase detection signal, a first flipflop configured to latch the write clock signal in response to the phase detection signal to generate a phase flag, a second flipflop configured to latch the phase flag in response to the phase detection signal to generate a shifted phase flag, a first logic gate configured to perform a logic operation on the phase flag and the shifted phase flag, a second logic gate configured to perform a logic operation on an output signal of the first logic gate and the shifted phase flag to generate a shifted read clock signal, a third flipflop configured to latch a first voltage level in response to the shifted read clock signal, and a third logic gate configured to generate the detection signal in response to an output signal of the third flipflop and the shifted read clock signal.

4. The read clock generation circuit according to claim 1, wherein the correction circuit comprises:

a latch configured to latch the detection signal in response to the preliminary read clock signal to generate a read clock-valid section signal, and a logic gate configured to perform a logic operation on the read clock-valid section signal and the preliminary read clock signal to output the read clock signal.

5. A data processing circuit comprising:

a read clock generation circuit configured to output, as a read clock signal, a divided clock signal having a fastest second edge after a first edge of a write clock signal, among a plurality of divided clock signals, based on a result of a phase comparison between a preliminary read clock signal and the write clock signal, wherein the preliminary read clock signal is selected from the plurality of divided clock signals; and a first in first out (FIFO) circuit configured to receive input data in response to the write clock signal, and output the input data as output data in response to the read clock signal.

6. The data processing circuit according to claim 5, further comprising a division circuit configured to divide a source clock signal by a division ratio to generate the plurality of divided clock signals.

7. The data processing circuit according to claim 5, wherein the plurality of divided clock signals has a same phase difference therebetween.

8. The data processing circuit according to claim 5, wherein the read clock generation circuit comprises:

a multiplexer configured to select one of the plurality of divided clock signals in response to a selection signal, and output the selected divided clock signal as the preliminary read clock signal;

a detection circuit configured to generate a detection signal based on the result of the phase comparison between the preliminary clock signal and the write clock signal, the detection signal indicating detection of the divided clock signal having the fastest second edge after the first edge of the write clock signal, among the plurality of divided clock signals;

a counter configured to count the write clock signal in response to the detection signal to generate the selection signal; and a correction circuit configured to deactivate the preliminary read clock signal during an invalid section determined in response to the detection signal to output a read clock signal.

9. The data processing circuit according to claim 8, wherein the detection circuit comprises:

a phase detector configured to compare a phase of the preliminary read clock signal with a phase of the write clock signal to generate a phase detection signal, a first flipflop configured to latch the write clock signal in response to the phase detection signal, to generate a phase flag, a second flipflop configured to latch the phase flag in response to the phase detection signal to generate a shifted phase flag, a first logic gate configured to perform a logic operation on the phase flag and the shifted phase flag, a second logic gate configured to perform a logic operation on an output signal of the first logic gate and the shifted phase flag, to generate a shifted read clock signal, a third flipflop configured to latch a first voltage level in response to the shifted read clock signal, and a third logic gate configured to generate the detection signal in response to an output signal of the third flipflop and the shifted read clock signal.

10. The data processing circuit according to claim 8, wherein the correction circuit comprises:

a latch configured to latch the detection signal in response to the preliminary read clock signal, to generate a read clock-valid section signal, and a logic gate configured to perform a logic operation on the read clock-valid section signal and the preliminary read clock signal to output the read clock signal.

11. A serializer for converting parallel data into serial data, comprising:

a division circuit configured to divide a source clock signal by a division ratio to generate a plurality of divided clock signals;

a multiplexer configured to select one of the plurality of divided clock signals in response to a selection signal, and output the selected divided clock signal as a preliminary read clock signal;

a detection circuit configured to generate a detection signal based on a result of a phase comparison between the preliminary read clock signal and a write clock signal, the detection signal indicating detection of a divided clock signal having a fastest second edge after a first edge of the write clock signal, among the plurality of divided clock signals;

a counter configured to count the write clock signal in response to the detection signal to generate the selection signal;

a correction circuit configured to deactivate the preliminary read clock signal during an invalid section determined in response to the detection signal to output a read clock signal; and a first in first out (FIFO) circuit configured to receive input data in response to the write clock signal, and output the input data as output data in response to the read clock signal.

* * * * *